United States Patent [19]

Shah et al.

[11] Patent Number: 4,918,658

[45] Date of Patent: * Apr. 17, 1990

[54] STATIC RANDOM ACCESS MEMORY WITH ASYNCHRONOUS POWER-DOWN

[75] Inventors: Ashwin H. Shah, Dallas; Pallab K. Chatterjee, Richardson, both of Tex.

[73] Assignee: Texas Instruments Incorporated, Dallas, Tex.

[*] Notice: The portion of the term of this patent subsequent to Aug. 4, 2004 has been disclaimed.

[21] Appl. No.: 528,203

[22] Filed: Aug. 31, 1983

[51] Int. Cl.⁴ .............................................. G11C 7/00
[52] U.S. Cl. .................................. 365/227; 365/223.5; 365/226; 365/194
[58] Field of Search ............... 365/227, 203, 230, 194, 365/210, 226, 233, 233.5

[56] References Cited

U.S. PATENT DOCUMENTS

| 4,231,110 | 10/1980 | Stinehelfer | 365/194 |
| 4,339,809 | 7/1982 | Stewart | 365/206 |
| 4,355,377 | 10/1982 | Sud et al. | 365/203 |
| 4,405,996 | 9/1983 | Stewart | 365/203 |
| 4,425,633 | 1/1984 | Swain | 365/194 |
| 4,917,328 | 11/1983 | Ochii | 365/227 |

FOREIGN PATENT DOCUMENTS 2060303 4/1981 United Kingdom ................ 365/227

OTHER PUBLICATIONS

"4K Static RAMs Give Fast Access", Electronics, May 13, 1976, pp. 137–138, vol. 49, No. 10.
Konishi et al., "A 64 Kb CMOS RAM", IEEE International Solid State Circuits Conference, Digest of Tech. Papers, Feb. 12, 1982, pp. 258–259, 333.

Primary Examiner—Glenn A. Gossage
Attorney, Agent, or Firm—William E. Hiller; N. Rhys Merrett; Melvin Sharp

[57] ABSTRACT

A static random access memory, wherein power consumption is reduced by using asynchronous edge-triggered power down gates to power up only elements in the critical circuit path for only as long as necessary to access the memory. Thus, power consumption in the memory is reduced to nearly an absolute minimum. This invention uses the address transition clock to provide an asynchronous power up function to various parts of the static RAM so that only the circuit which is propagating the signal is powered up and the power is held high just long enough for the signal to propagate. This is performed using intrinsic timing elements of the RAM critical path so that the timing of the signal and power cycles track each other.

3 Claims, 2 Drawing Sheets

EDGE TRIGGERED AUTO POWER DOWN FOR STATIC RAMS

STATIC RANDOM ACCESS MEMORY WITH ASYNCHRONOUS POWER-DOWN

BACKGROUND AND SUMMARY OF THE INVENTION:

The present invention relates to static random access memories.

The key desiderata in static random access memories (SRAMs) are speed, density, and power dissipation. Power dissipation is quite important, because there are typically important trade-offs between power and speed. That is, the high-current logic elements used to achieve high speed will normally imply high power dissipation, and power dissipation per unit area puts a grave limitation on density. Thus, any circuit architecture improvement which can generally reduce power dissipation will provide substantial advantages in the SRAM art.

Thus, it is an object of the present invention to provide a circuit architecture which reduces power dissipation in SRAMs.

The use of a power down feature in high speed static RAMs is known. This allows the system to power up a few RAM chips on a memory board and fetch data from these chips while the rest are powered down. This allow the duty cycle for the power dissipation to be small and therefore the average active power of the chip can be increased, thereby increasing the speed of the SRAM. Since the sRAM is asynchronous in operation, the chip select or enable signals were required to serve to initiate a read or write cycle with the currently valid address. Further improvement in SRAM access time was obtained by edge-triggered operations in the address path. This operation recognized a SRAM cycle to be asynchronous, and one that could be initiated by any address transition, if the chip was selected. The transition on any address line was detected and used to generate an internal clock to be used to precharge bit lines and allow sense amplifiers to recover to the balanced state before the next cell was decoded. The use of this edge triggered (or "address transition bus" or "X-pulse") technique is quite widespread in many state-of-the-art SRAMs, serving the purpose described above.

This approach reduces the power consumption of a chip, and therefore permits higher-speed elements to be used, without violating the constraints on average power dissipation per unit area averaged over the thermal relaxation time. However, even in this approach, elements are powered up for significant amounts of time when they are not actually in the signal path. For example, in a sample state-of-the-art SRAM technology, after an address transition (when the row and/or column address inputs provided at the external pins of the memory package change), it will typically take 2 to 5 ns for the address buffer to change state, 4 to 5 ns more for the row decoder to change state, and 4 to 5 additional ns before the pass transistors in the row-selected memory cells in each column are open. Typically, another 15 to 20 ns will be required for the sense amplifier to change state. The column decoders require only 5 or 6 ns, after they have received the address, to raise a line connecting the sense amplifier of the selected column to the output buss. Thus, the sense amplifer is not actually in the signal path until 10 ns or so after the address buffer changes state. The column select logic is not actually in the signal path until about 25 ns after the address buffer changes state. Moreover, the row decode logic is not in the signal path for more than about 10 or 15 ns after the address buffer has changed state. Thus, in the prior art all of these logic elements must be powered up during most of the read cycle, i.e., for 40 ns or more (until a first stage of the output buffer has changed state). This means that excessive power is being consumed. That is, each individual element in the signal path is being powered up for a total time which is much more than the time during which it is actually required to perform its function. While any individual element absorbs only a small amount of electrical energy during this excess power-up time, the net effect of this is that the total power dissipation of the peripheral elements is several times that required, and the average power dissipation of the SRAM (i.e., cell power dissipation plus peripheral power dissipation) is unnecessarily increased.

Thus, it is an object of the present invention to provide an SRAM wherein power dissipation in the peripheral circuits is minimized.

It is a further object of the present invention to provide an SRAM wherein the power dissipation in the peripheral circuits is not substantially larger than that strictly required for power-up of each circuit element during propagation of the signals.

The present invention differs from the conventional use of the address transition detection in the use of the clock to power up the signal propagation path synchronously with respect to the signal flow and in the use of the internal critical path timing elements to synchronize the power up times with the signal flow times, thereby reducing the active power dissipation cycle to the very minimum possible without degrading the speed of the SRAM. Since the timing elements used are identical for the signal and power path, they track each other over process variations and over temperature variations. In particular, dummy elements are used (such as dummy column address decoders) to provide the appropriate delays for the asynchronous power-up signals to activate the corresponding power elements, such as the actual column decoders. By this innovation, exact matching of the asynchronous signals to the appropriate delays needed to activate the power elements are perfectly tailored. That is, process variations which may cause changes in the propagation speed of logic elements will be mirrored by the propagation speed of the dummy elements so that the asynchronous power-up signals will still be provided to the actual power logic elements at the right time.

According to the present invention, there is provided:

A static random access memory comprising:
an array of memory cells arranged in rows and columns;
address decoder means for receiving a plurality of address bits to select a particular one of said memory cells;
said address decoder comprising a row address decoder to decode bits of said address bits corresponding to a row of said array, and a column address decoder to decode bits of said address bits corresponding to a column of said array; and
power-up means, connected to said address bits and to said row and column address decoders, for detecting a transition in said address bits and for powering up said row decoder first and subsequently powering up said column decoder, whenever a transition in said address bits is detected.

BRIEF DESCRIPTION OF THE DRAWINGS

The present invention will be described with reference to the accompanying drawings, wherein.

DETAILED DESCRIPTION OF THE PREFERRED EMBODIMENT

The present invention will be described with reference to a static random access memory using conventional six transistor cells, and the decoders, sense amplifiers, and other peripheral circuits are in most respects conventional. However, the power-up signals for the address buffers, decoders and preamplifiers are governed by delayed asynchronous power-up signals as set forth below.

Figure 1:
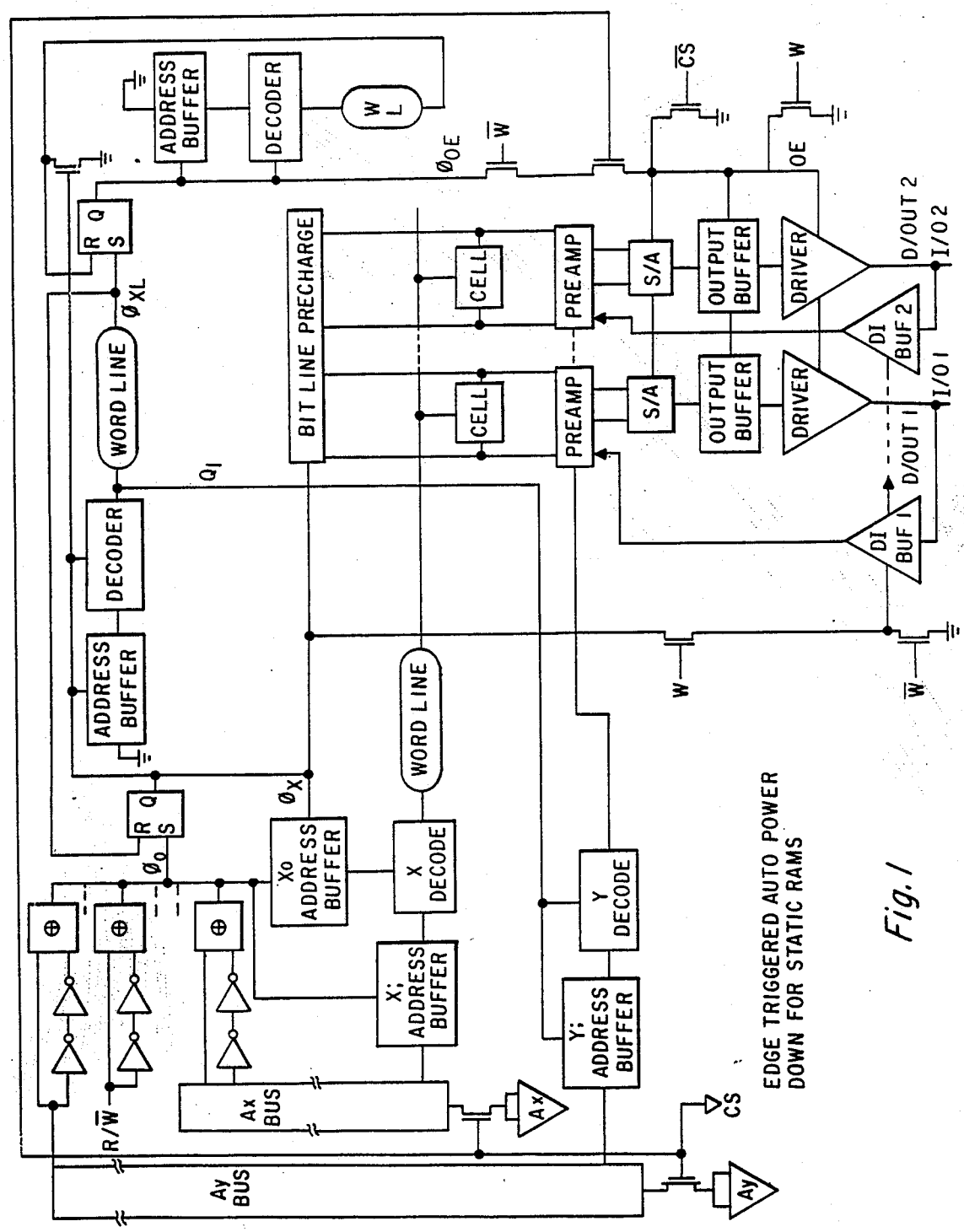
FIG. 1 shows organization of a static random access memory to the present invention.

The architecture of the SRAM according to this invention is shown in FIG. 1. All address lines, and the read/write lines are gated by chip select and connected to an edge detect circuit consisting of a delay element and an exclusive OR logic, the output of which forms a common bus which detects the transition in any address or in read/write when the chip is selected. This signal is defined as $\phi o$ as shown in FIG. 2.

The use of the chip select gating and the inclusion of the read/write signal on the transition detection buss are features of this invention which are different from the traditional architecture. However, the transition detector is architecturally the same as in a conventional edge triggered SRAM. The conventional SRAMs use the signal $\phi o$ perform presetting functions and equilbrating functions on the SRAM bit line and sensing circuits, to improve speed. In the architecture according to this invention, even though chip select is high, only a transition in the address or read write signal which is larger than the delay element in the transition detector will initiate a power up chain. The signal $\phi o$ immediately powers up the x-address buffer and allows the x-address to propagate through. This is the first element in the critical path of the SRAM and must be powered up as soon after the address transition as possible. The delay in this power up signal is determined by the delay in the transition detector circuit and is determined by the amount of noise rejection desired on the system lines. This is because the noise glitches in the system lines can be interpreted as address transitions by the SRAM. This problem is, of course, common to all edge triggered architectures. The $\phi o$ pulse also initiates a delay chain by setting a flip flop, the output of which powers up a dummy address buffer, decoder and word line driver with a preset signal (shown as ground in FIG. 1.). This timing chain consists of elements identical to that of the actual signal flow through the set of address buffers, decoders and word line drivers, and word lines, so that the delay will track.

That is, it is preferable but not necessary that actual logic elements be used in a dummy path (i.e., in the power-up control path) to emulate the same logic elements used in the actual signal path. This means that a precise timing emulation will be provided without the designer having to calculate timings. It also means that the delay provided will be insensitive to process variations, since the delay characteristics of the dummy elements will exactly track those of the signal-path elements. However, it is also possible, although not preferred, to use delay elements instead of exact duplicate elements. In particular, while it is possible to emulate the word line with a polysilicon meander line having the same total length and including the same length over moat, it is preferable to emulate the word line merely as a somewhat shorter polysilicon line connected to a capacitor, to provide approximately the same RC time constant.

Figure 2:
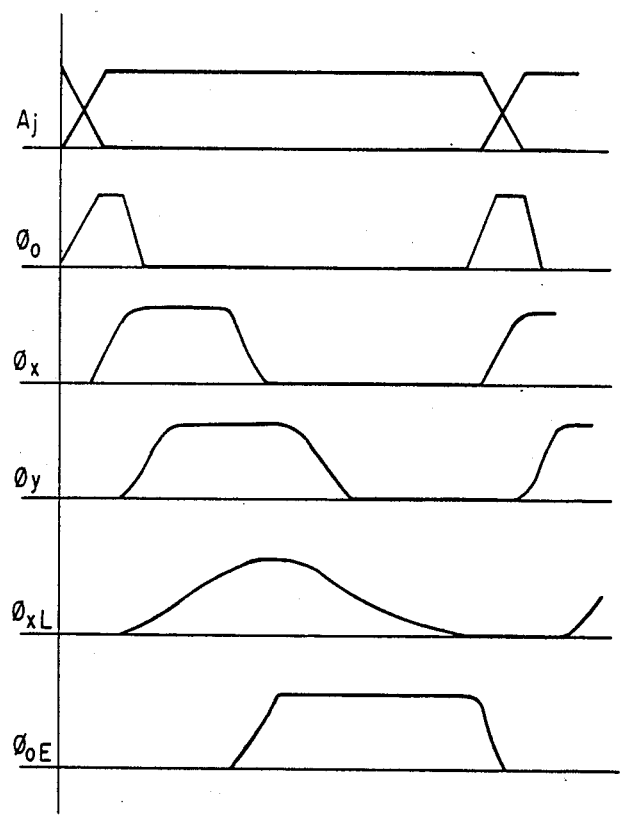
FIG. 2 is a timing chart of waveforms appearing at the marked points in the layout of FIG. 1.

The dummy path has a predetermined signal so that the output $\phi XL$ goes high to reset the flip flop whose output is the signal $\phi X$ shown in FIG. 2. This signal is used to hold the power in the address buffers long enough to allow the X- decode circuit to drive the proper word line and access the cell which puts the data on the bit lines. Simultaneously, $\phi X$ also powers up the X- decode and the bit line precharge circuits, and the data in buffers if the chip is in a write mode.

The column address in the SRAM is not in the critical timing path, since it is required only after the word line has gone high. The power up signal for the column path is therefore activated after the X- address (row address) signal has arrived at the X-decoder. This is very simply done in the X- power up chain by tapping of the $\phi X$ signal after the dummy decoder in the timing generator path. The $\phi X$ signal then has a timing relationship with respect to the $\phi X$ signal as shown in FIG. 2. This timing signal powers up the Y address buffer and the Y address (column address) decoder during the period when the X- word line is being driven, and holds the decoder output until the word line is fully activated, after which it is powered down. Thus it is powered up just long enough to determine which bit line the data must be taken from.

The second power timing chain that is activated by the signal $\phi XL$ is identical to the first timing chain. This timing chain is used to define the power- up signal for the sense amplifier and the output driver circuit if the chip is in the read mode. The power up timing is also generated using the word line delay because the fall time of the previously selected word line determines the deselect time, and the sense amplifier/output circuit must hold the output data till the next cell is selected. The $\phi OE$, signal shown in FIG. 2, is used to power up the pre amp, sense amp and the output buffer in the period during which the data of the bit lines is propagated through this section. The sensing circuit is preferably of a latching type so that the data can be held after the column and row circuits are powered down. The use of a latching sense amp also preserves the output valid when the rest of the SRAM has completed the power up cycle, if another transition is not detected. This allows the asynchronous fully static operation from the system point of view to be preserved. Thus the output data is preserved via the power in a small latch rather than having the entire SRAM powered up to hold the data. Thus the duty cycle over which the active circuits are powered up are equal to the time required for them to propagate the signal through, thus making them most efficient in the use of power in the SRAM:

That is, the location of the first latch determines how much of the SRAM must remain powered up to keep the output data valid. The present invention permits circuits prior to the first latch to be powered down. The presently preferred embodiment uses a latching sense amplifier, so that the sense amplifier and output buffer must remain in a power-up condition, after an address transition, for as long as the chip is enabled. However, this is not a necessary element of the present invention. In particular, an alternative embodiment of the present invention uses a latching output buffer, and controls all circuits prior to the output buffer (row decoder, column decoder, and sense amplifiers) with asynchronous power-down signals according to the present invention, so that, when the chip remains enabled after an address transition but no further address transition has occurred, power is drawn only by the output buffer, which is itself sufficient to hold the output data valid.

As noted above, a further novel feature of the present invention is that the write enable bit is one of the bits connected to the address transition edge detector, to initiate an asynchronous power-up cycle according to the present invention. Asynchronous power-up operation is particularly advantageous in the write mode, where large power dissipation densities will occur in some of the peripheral circuits. However, in this case it is necessary to provide a power-down architecture which will allow for the case where a single bit is written immediately after it has been read. In this case, only a write enable bit would change state. This condition is adequately treated by the present invention, but is is not adequately treated by all prior art circuits.

A further alternative embodiment of the present invention uses a different set of dummy elements to determine the delays used during the write mode. That is, in the write mode (in the embodiment) the column decoder must be powered up before the sense amplifier, rather than vice versa. Preferably, the row decoder will still be powered up first of all.

The present invention has been discussed with primary reference to static random access memories, since it is in static random access memories that critical constraints on power dissipation are combined with the relatively predictable signal path. Without regard to whether any particular memory technology may be generally referred to by those skilled in the art as a "static RAM", it may be noted that the present invention is applicable to any memory having fully static (i.e., not externally clocked) operation. Dummy elements are used to define the proper delays, so that peripheral circuits in the signal path are powered up only as needed. Preferably separate power-up timings are provided for the read mode and for the write mode.

It should also be noted that the designations of "row decoder" and "column decoder" used above are defined merely so that the "row decoder" is the one which has the longer delay, i.e., which is in the critical timing path. In conventional art, the row decoder drives word lines which are typically polysilicon or polycide, and therefore have a long time constant. These word lines are usually shown in drawings of an array as running horizontally across the array. However, regardless of which axis of the array is drawn as horizontal or which axis of the array is referred to by the manufacturer as a "row", the term "row" as used in the present specification and claims refers to the axis of the array along which the access time is in the critical delay path.

As will be appreciated by those skilled on the art, the present invention may be modified and varied to produce a very wide range of embodiments. The scope of the present invention is therefore expressly not limited except as set forth in the accompanying claims.

What is claimed is:

1. A static random access memory comprising:
 (a) an array of memory cells arranged in rows and columns;
 (b) address decoder means for receiving a plurality of address bits to select a particular one of said memory cells;
 (c) said address decoder comprising row address decoder means to receive and decode bits of said address bits corresponding to a row of said array, and column address decoder means to receive and decode bits of said address bits corresponding to a column of said array; and
 (d) power-up means, connected to said row and column address decoder means, and responsive to a transition of predetermined duration of said address bits, to provide an asynchronous first power up energy signal to said row decoder means to provide power to said row decoder means and, means responsive to said first energy signal, to subsequently asynchronously provide a power up energy signal to said column decoder means and asynchronously remove said power up energy signal from said row decoder means.

2. The memory of claim 1, wherein each said column of cells comprises a sense amplifier, and wherein said power-up means is connected to said sense amplifiers to power up said sense amplifiers after said row address decoder has been powered up.

3. The memory of claim 1, wherein said power-up means further includes means to detect a write enable bit and to detect a transition in said write enable bit.

* * * * *